(12) United States Patent
Narita

(10) Patent No.: US 6,480,017 B2
(45) Date of Patent: Nov. 12, 2002

(54) EVALUATING PATTERN FOR MEASURING AN EROSION OF A SEMICONDUCTOR WAFER POLISHED BY A CHEMICAL MECHANICAL POLISHING

(75) Inventor: Tadashi Narita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/770,501

(22) Filed: Jan. 29, 2001

(65) Prior Publication Data

US 2002/0036505 A1 Mar. 28, 2002

(30) Foreign Application Priority Data

Sep. 22, 2000 (JP) ........................................ 2000-288451

(51) Int. Cl.⁷ ..................... G01R 31/26; H01L 21/4763; B24B 1/00
(52) U.S. Cl. ........................ 324/765; 438/633; 451/56
(58) Field of Search ................................. 324/765, 766, 324/700, 71.2, 699; 257/48, 750, 752; 438/427, 8, 633; 451/56

(56) References Cited

U.S. PATENT DOCUMENTS 5,723,874 A * 3/1998 Baker et al. ................... 257/48
5,890,951 A * 4/1999 Vu .............................. 451/444

FOREIGN PATENT DOCUMENTS

JP 2000021882 A 1/2000
JP 2000058611 A 2/2000

* cited by examiner

Primary Examiner—Christine K. Oda
Assistant Examiner—James Kerveros
(74) Attorney, Agent, or Firm—Volentine Francos P.L.L.C.

(57) ABSTRACT

An evaluating pattern includes conductive pattern which has a rectangular configuration, an insulating layer which is formed on the conductive pattern, and a conductive material filled into contact holes which is formed in the insulating layer on the middle of the conductive pattern.

15 Claims, 4 Drawing Sheets

EVALUATING PATTERN FOR MEASURING AN EROSION OF A SEMICONDUCTOR WAFER POLISHED BY A CHEMICAL MECHANICAL POLISHING

The present application claims priority under 35 U.S.C. §119 to Japanese Application No. 2000-288451, filed on Sep. 22, 2000, which is hereby incorporated by reference in its entirely for all purposes.

BACKGROUND OF THE INVENTION

1. Field of the Invention

The present invention relates to an evaluating pattern for measuring an erosion of a semiconductor wafer polished by a chemical mechanical polishing method.

2. Description of the Related Art

A chemical mechanical polishing method (CMP method) has bees used for forming a semiconductor device. As normally, a plurality of semiconductor devices are simultaneously formed on a semiconductor wafer, such CMP method is applied for the semiconductor wafer.

In the case where the CMP method is applied for a damascene process, occurrence of an erosion in a densely packed region where many contact holes or conductive lines are thick in a narrow distance. The erosion is that a thickness of an insulating region in the densely packed region becomes thin by the CMP method, compared with a predetermined thickness. The reason is reported that a speed of polishing the insulating layer becomes faster in the densely packed region.

If the thickness of the insulating layer becomes thinner beyond a permissible range by the erosion, it is possible that an insulation is broken or a current leak occurs in the semiconductor device.

The semiconductor wafer which includes such semiconductor device having such excessive erosion is evaluated as a defective product by measuring the thickness of the insulating layer. A contact type measure for measuring bumps occurred by the erosion is used for such measurement.

As the contact type measure directly contacts with elements in the semiconductor device, it is possible to damage the elements. As a result, such damage may decline a yield of the semiconductor device.

SUMMARY OF THE INVENTION

An object of the present invention is to provide an evaluating pattern for measuring an erosion of a semiconductor wafer polished by a chemical mechanical polishing method.

To achieve the object, an evaluating pattern of one typical invention is comprised of a conductive pattern which has a rectangular configuration, an insulating layer which is formed on the conductive pattern, and a conductive material filled into contact holes which is formed in the insulating layer on the middle of the conductive pattern.

According to the present invention, it is easy to recognize the evaluation pattern on a semiconductor wafer. As a measuring point is arranged in the middle of the rectangular conductive pattern, it is facile to identify the measuring point. That is, the measuring point in the middle of the rectangular conductive pattern is easily identified by recognizing sides of the rectangular conductive pattern.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1($b$) is a cross section at a portion along line X–'X shown in FIG. 1($a$).

FIG. 3($b$) is a cross section at a portion along line X–'X shown in FIG. 3($a$).

DESCRIPTION OF THE PREFERRED EMBODIMENTS

The present invention will be described hereinafter with reference to the accompanying drawings. The drawings used for this description typically illustrate major characteristic parts in order that the present invention will be easily understood.

Figure 1A:
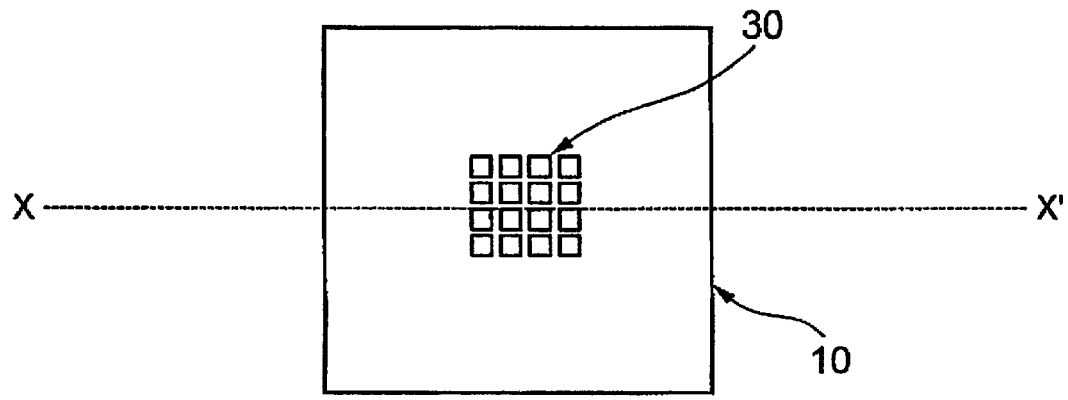
FIG. 1($a$) is a plane view describing an evaluating pattern according to a first preferred embodiment.
Figure 1B:
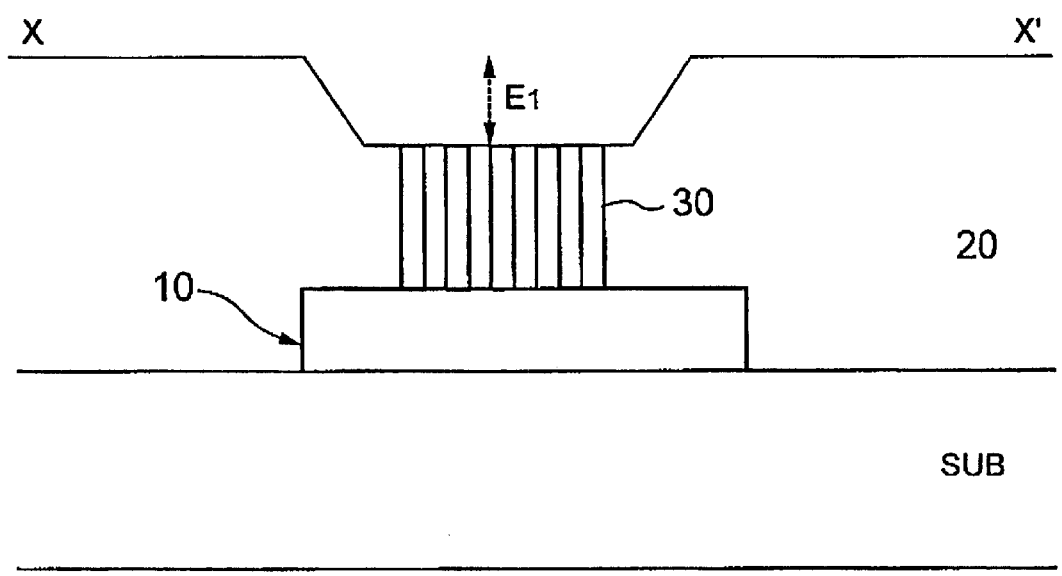
Figure 2A:
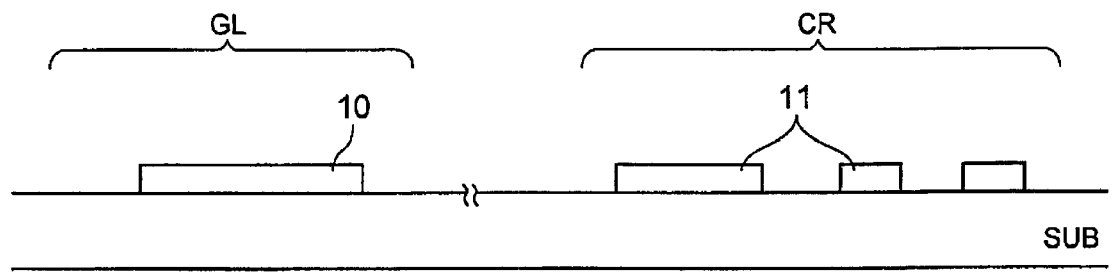
FIG. 2($a$) to FIG. 2($c$) are cross sections describing processes for forming the evaluating pattern shown in FIG. 1.
Figure 2B:
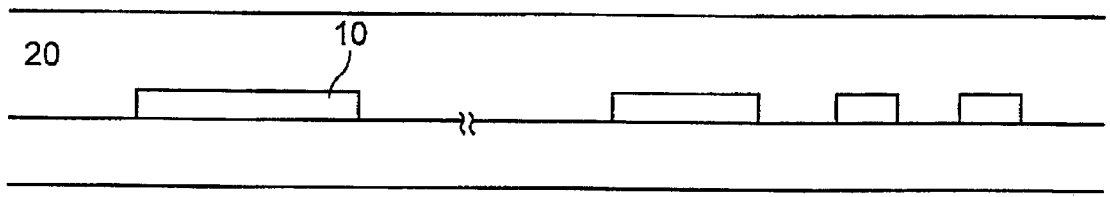

A first preferred embodiment is described hereinafter referring to FIG. 1 and FIG. 2. FIG. 1($a$) is a plane view describing an evaluating pattern according to a first preferred embodiment. FIG. 1($b$) is a cross section at a portion along line X–'X shown in FIG. 1($a$). FIG. 2($a$) to FIG. 2($c$) are cross sections describing processes for forming the evaluating pattern shown in FIG. 1.

The evaluating pattern is comprised of a rectangular conductive pattern 10, an intermediate insulating layer 20, a conductive material 30 which is filled into contact holes formed in the insulating layer 20 on the middle of the conductive pattern 10.

The evaluating pattern is located on grid lines GL which partition off a semiconductor wafer SUB into chip regions CR where a plurality of semiconductor chips are formed thereon. That is, the chip regions CR are respectively divided on the semiconductor wafer SUB by the grid lines GL. If there is a space for the evaluating pattern in the chip regions CR, the evaluating pattern may be formed in the chip region CR.

The conductive pattern 10 is a rectangular configuration which is comprised of aluminum (Al). Naturally, other conductive materials can be applied for the conductive pattern 10. The conductive pattern 10 is formed on the grid line GR while conductive lines are formed in the chip regions CR, as shown in FIG. 2($a$).

The intermediate insulating layer 20 is comprised of silicon dioxide (SiO2). The insulating layer 20 is not limited to a single layer, a multiple insulating layer can be used. For example, the multiple insulating layer is comprised of a silicon oxide layer which includes fluorine (SiOF) and a silicon dioxide layer (SiO2) which is formed on the silicon oxide layer which includes fluorine (SiOF). The insulating layer 20 is simultaneously formed on the chip regions CR and the grid lines GR, as shown in FIG. 2($b$).

Figure 2C:
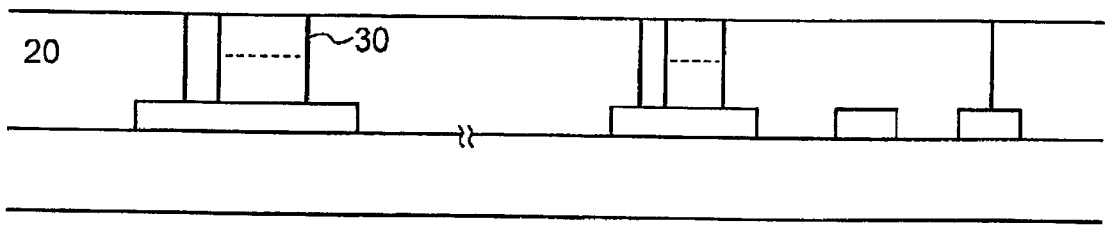

The conductive material 30 is comprised of a refractory metal or a compound made up of the refractory metal and other material, such as tungsten (W) titanium (Ti) and titanium-nitride (TiN). This conductive material 30 is filled into contact holes which are formed in the insulating layer 20, as shown in FIG. 2(c).

An erosion which occurs in the evaluating pattern is equivalent to an erosion which occurs in a densely packed region in the chip region CR. That is, the evaluating pattern shows an erosion that has occurred in the densely packed region where many contact holes or conductive lines are thick along a narrow distance in the chip region. Therefore, the erosion that has occurred in the chip region CR can be evaluated by measuring the erosion in the evaluating pattern.

The erosion in the evaluating pattern can be measured by a contact type measure for measuring bumps occurred by the erosion. For example, the erosion is measured by scanning the measure along line X–X' shown in FIG. 1(b).

In this embodiment, the contact holes are located on the middle of the conductive pattern 30 at the density of 25%. Each distance between the neighboring contact holes is substantially equal. The density can be designed by a designer corresponding to the density of contact holes or conductive lines in the chip regions. That is, the contact holes in the evaluating patter are located according to the highest density in the chip regions CR. As the conductive pattern 10 is simultaneously formed with the conductive patterns in the chip region CR, a rectangular pattern which are similar to the conductive patterns in the chip region is suitable for the conductive pattern 10.

According to the first preferred embodiment, it is easy to recognize the evaluation pattern among many various patterns on a semiconductor wafer. As a measuring point is arranged in the middle of the rectangular conductive pattern, it is facile to identify the measuring point. That is, the measuring point in the middle of the rectangular conductive pattern is easily identified by recognizing sides of the rectangular conductive pattern. Further, in the case where the rectangular configuration of the conductive pattern is a square, as distance between the middle of the conductive pattern and one side is equal, a measurement from any directions is allowable. Therefore, a facility of the measurement can be raised.

Figure 3A:
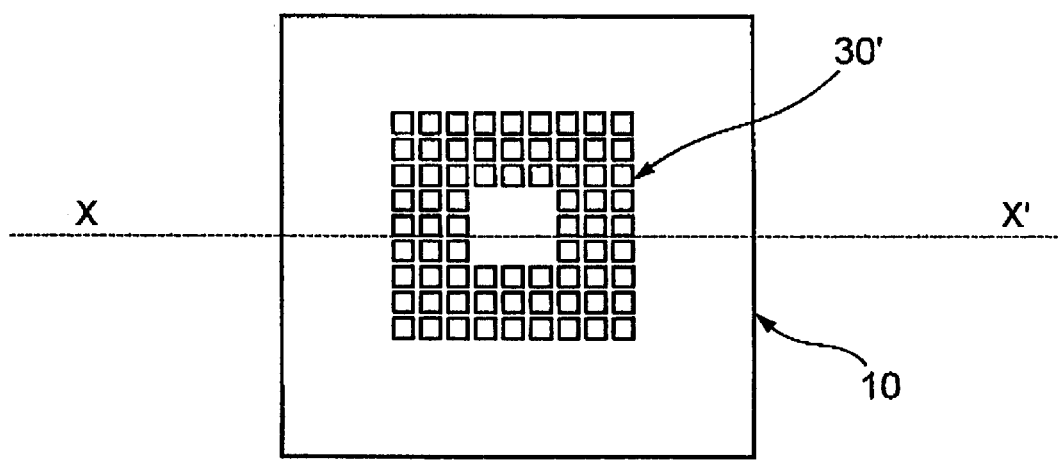
FIG. 3($a$) is a plane view describing an evaluating pattern according to a second preferred embodiment.
Figure 3B:
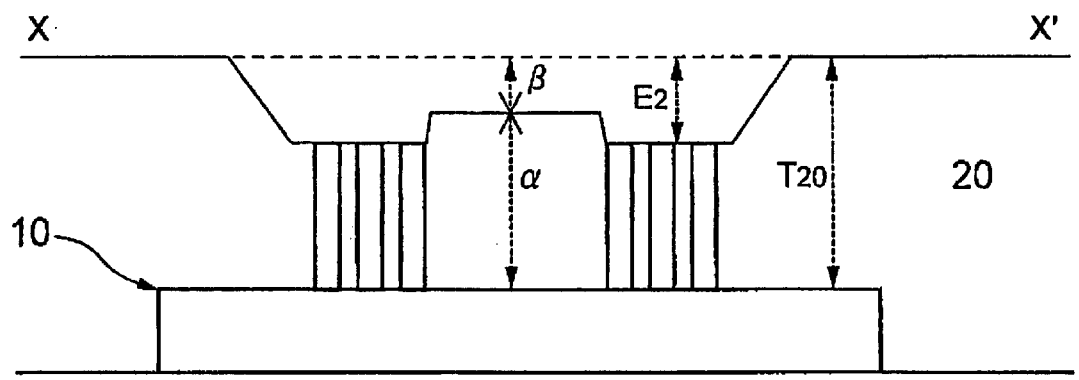
Figure 4:
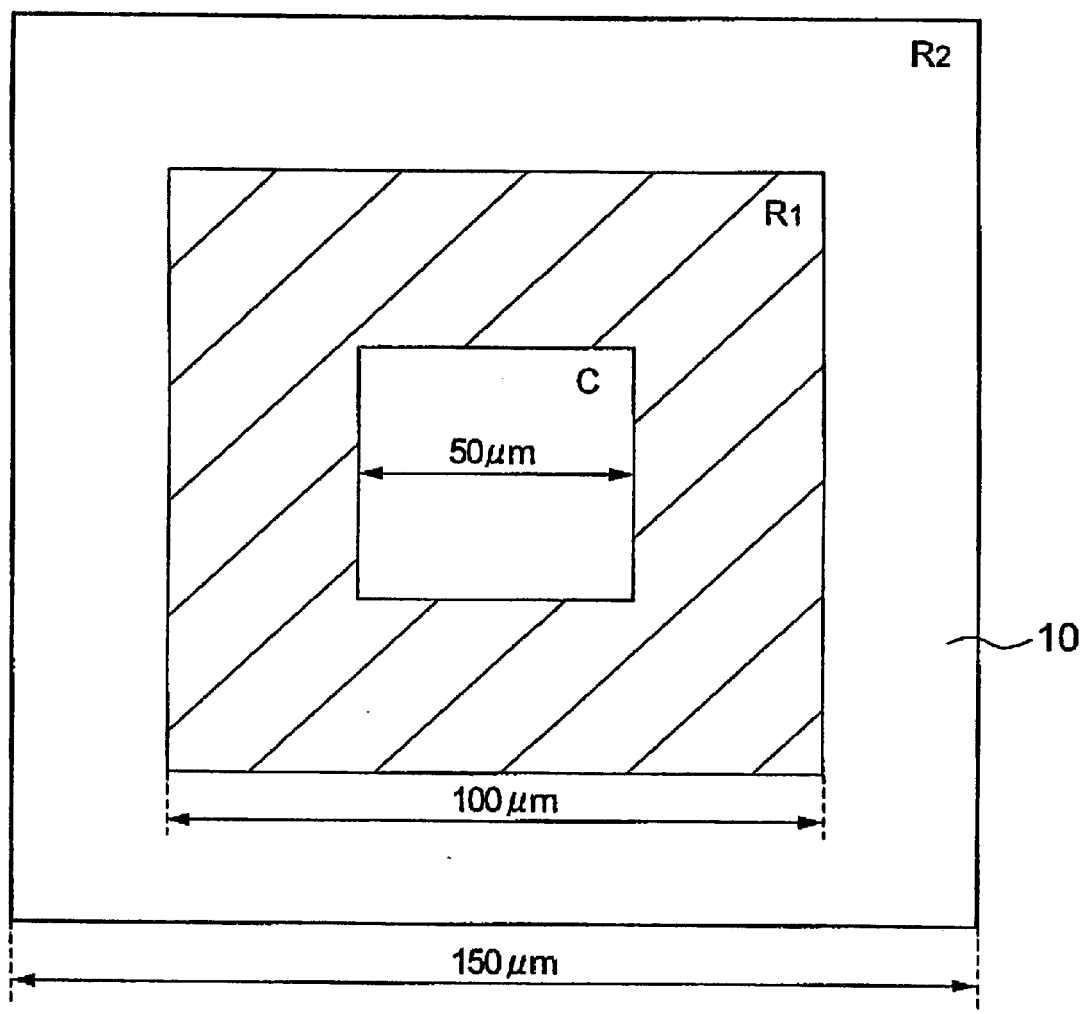
FIG. 4 is a plane view describing the evaluating pattern shown in FIG. 3.

A second preferred embodiment is described hereinafter referring to FIG. 3 and FIG. 4. FIG. 3(a) is a plane view describing an evaluating pattern according to a second preferred embodiment. FIG. 3(b) is a cross section at a portion along line X–'X shown in FIG. 3(a). FIG. 4 is a plane view describing the evaluating pattern shown in FIG. 3. The same elements mentioned above are marked at the same symbols and a description thereof is omitted.

The evaluating pattern of this embodiment is comprised of a rectangular conductive pattern 10, an intermediate insulating layer 20, a conductive material 30 which is filled into contact holes formed in the insulating layer 20 on the middle of the conductive pattern 10. In this embodiment, an arrangement of the contact holes differs from that of the first preferred embodiment.

That is, the conductive pattern 10 has a central region C, a first region R1 which surrounds the central region C and a second region R2 which surrounds the first region R2, as shown in FIG. 4. In this embodiment, length of one side in the central region C is 50 $\mu$m, length of one side in the first region R1 is 100 $\mu$m and length of one side in the second region R2 is 150 $\mu$m. These sizes are properly defined by a designer. If the length in the central region is comparatively long as this embodiment, a popular optical measure for measuring the erosion can be used. However, if the length in the central region is short, that is, the central region becomes narrow, a sophisticated optical measure for measuring the erosion is necessary to measure the erosion.

In this embodiment, the contact holes are formed in the insulating layer 20 in the first region R1. The conductive material 30 are filled into the holes. That is, the contact holes are not arranged in the central region C. Also, the contact holes are not arranged in the second region R2. The erosion does not occur in the second region R2. The contact holes, that is the conductive material 30, are symmetric with the central region C. Similar to the first embodiment, each distance between the neighboring contact holes is equal.

As the contact holes are not arranged in the central region C, it is difficult to arise an erosion therein, compared with the first region R1. That is, some erosions may be occurred by the effect from the contact holes in the first region R1. However, as a densely arrangement is not in the central region C, an excessive erosion does not occur in the central region C.

Similarly, the evaluating pattern of this embodiment is located on the grid lines GL. Each element in this embodiment can be formed by the processes described in the first preferred embodiment.

Similarly, an erosion which occurs in the evaluating pattern is equivalent to an erosion which occurs in a densely packed region in the chip region CR. That is, the evaluating pattern shows an erosion that has occurred in the densely packed region where many contact holes or conductive lines are thick along a narrow distance in the chip region. Therefore, the erosion that has occurred in the chip region CR can be evaluated by measuring the erosion in the evaluating pattern. In this embodiment, the erosion is evaluated by measuring thickness T20 of the insulating layer 20 in the second region R2 and thickness a of the insulating layer 20 in the central C, using a non-contact type optical measure. The optical measure can measure thickness of bumps occurred by the erosion without contacting. The differential thickness $\beta$ is counted by the thickness T20 and the thickness $\alpha$. The erosion E2 is calculated by an interrelation between the differential thickness $\beta$ and the erosion E2. The interrelation is defined by a designer in advance.

Similar to the first embodiment, directly measurement by the contact type measure for measuring bumps occurred by the erosion can be applied for this embodiment, an indirectly measurement is shown in this embodiment without using the contact type measure.

The density of the contact holes in the first region R1 can be designed by a designer corresponding to the density of contact holes or conductive lines in the chip regions. That is, the contact holes in the evaluating patter are located according to the highest density in the chip regions CR. As the conductive pattern 10 is simultaneously formed with the conductive patterns in the chip region CR, a rectangular pattern which are similar to the conductive patterns in the chip region is suitable for the conductive pattern 10.

According to the second preferred embodiment, in addition to the effect of the first preferred embodiment, an erosion occurred in the first region can be precisely measured by measuring thickness of the insulating layer in the central region and the first region.

As the result, an evaluating pattern for measuring an erosion of a semiconductor wafer polished by a chemical mechanical polishing can be realized without declining a yield of the semiconductor device.

The present invention has been described above with reference to illustrative embodiments. However, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. An evaluating pattern for measuring erosion of a semiconductor wafer which is polished by chemical mechanical polishing, comprising:

a conductive pattern which has a rectangular configuration;

an insulating layer which is formed on the conductive pattern;

contact holes formed through the insulating layer to the conductive pattern; and a conductive material filled into the contact holes.

2. The evaluating pattern according to claim 1, wherein distances between adjacent contact holes are equal.

3. The evaluating pattern according to claim 1, wherein the conductive pattern is a square configuration.

4. The evaluating pattern according to claim 1, wherein the insulating layer is comprised of a first silicon oxide layer and a second silicon oxide layer which is formed on the first silicon oxide layer, wherein the first silicon oxide layer includes fluorine and the second silicon oxide layer does not include fluorine.

5. The evaluating pattern according to claim 1, wherein the evaluating pattern is formed on a grid line which partitions the semiconductor wafer into a plurality of semiconductor chips.

6. The evaluating pattern according to claim 1, wherein the contact holes are formed through the insulating layer to a middle area of the conductive pattern.

7. The evaluating pattern according to claim 1, wherein the conductive pattern is formed on the semiconductor wafer.

8. The evaluating pattern according to claim 1, wherein a density of the contact holes with respect to an area of the insulating layer through which the contact holes are formed is set to correspond to a density of an area in a chip region of the semiconductor wafer which has a greatest density of contact holes or conductive patterns.

9. An evaluating pattern for measuring erosion of a semiconductor wafer which is polished by chemical mechanical polishing, comprising:

a rectangular conductive pattern which has a middle region, a first region which surrounds the middle region and a second region which surrounds the first region;

an insulating layer which is formed on the first, second and middle regions of the rectangular conductive pattern;

contact holes formed through the insulating layer to the first region of the rectangular conductive pattern; and a conductive material filled into the contact holes.

10. The evaluating pattern according to claim 9, wherein the contact holes are symmetrical with respect to the middle region.

11. The evaluating pattern according to claim 9, wherein erosion at the first region is determined based on a thickness of the insulating layer over the middle region and the second region.

12. The evaluating pattern according to claim 9, wherein the rectangular conductive pattern is formed on the semiconductor wafer.

13. The evaluating pattern according to claim 9, wherein distances between adjacent contact holes are equal.

14. The evaluating pattern according to claim 9, wherein the evaluating pattern is formed over a grid line which partitions the semiconductor wafer into a plurality of semiconductor chips.

15. The evaluating pattern according to claim 9, wherein a density of the contact holes with respect to area of the first region is set to correspond to a density of an area in a chip region of the semiconductor wafer which has a greatest density of contact holes or conductive patterns.

* * * * *